United States Patent
Karon et al.

(10) Patent No.: US 10,890,450 B1
(45) Date of Patent: Jan. 12, 2021

(54) INFRASTRUCTURE RE-PURPOSED MAGNETIC SIGNATURE IN MOBILE DEVICE LOCALIZATION

(71) Applicants: Joshua Karon, Toronto (CA); Sean Huberman, Guelph (CA); Henry L. Ohab, Toronto (CA)

(72) Inventors: Joshua Karon, Toronto (CA); Sean Huberman, Guelph (CA); Henry L. Ohab, Toronto (CA)

(73) Assignee: MAPSTED CORP., Mississauga (CA)

(*) Notice: Subject to any disclaimer, the term of this patent is extended or adjusted under 35 U.S.C. 154(b) by 0 days.

(21) Appl. No.: 16/777,334

(22) Filed: Jan. 30, 2020

(51) Int. Cl.
| | |
|---|---|
| G01C 21/20 | (2006.01) |
| H04W 4/33 | (2018.01) |
| H04W 4/021 | (2018.01) |
| G01R 33/038 | (2006.01) |
| H04W 4/024 | (2018.01) |
| G01R 33/028 | (2006.01) |

(52) U.S. Cl.
CPC ....... *G01C 21/206* (2013.01); *G01R 33/0283* (2013.01); *G01R 33/0385* (2013.01); *H04W 4/021* (2013.01); *H04W 4/024* (2018.02); *H04W 4/33* (2018.02)

(58) Field of Classification Search
None
See application file for complete search history.

(56) References Cited

U.S. PATENT DOCUMENTS

| | | | |
|---|---|---|---|
| 6,539,327 B1 | 3/2003 | Dassot et al. | |
| 9,170,112 B2 | 10/2015 | Mirov et al. | |
| 9,557,178 B2 | 1/2017 | Ghose et al. | |
| 2009/0043504 A1* | 2/2009 | Bandyopadhyay | G01C 21/16 701/469 |
| 2013/0150076 A1 | 6/2013 | Kim et al. | |
| 2014/0180627 A1 | 6/2014 | Naguib et al. | |
| 2015/0018018 A1 | 1/2015 | Shen et al. | |
| 2016/0011022 A1 | 1/2016 | Zheng et al. | |
| 2016/0187457 A1* | 6/2016 | Chen | G01S 5/0252 342/451 |
| 2016/0261987 A1* | 9/2016 | Jovicic | H04W 4/024 |
| 2016/0379074 A1 | 12/2016 | Nielsen et al. | |
| 2017/0115364 A1* | 4/2017 | Efrat | G01R 33/10 |
| 2017/0132248 A1* | 5/2017 | Kim | H04W 4/029 |
| 2017/0265041 A1 | 9/2017 | Mahasenan et al. | |
| 2018/0356475 A1 | 12/2018 | Eitel et al. | |
| 2019/0271547 A1* | 9/2019 | Young | G01S 19/13 |
| 2020/0103232 A1* | 4/2020 | Chan | G01C 21/206 |

* cited by examiner

*Primary Examiner* — German Viana Di Prisco

(57) ABSTRACT

A method and system of infrastructure re-purposed magnetic signatures for mobile device indoor navigation and positioning. The method comprises determining a common spatial region in accordance with a first spatial region partially superimposed upon an at least a second spatial region, the first and at least a second spatial regions associated with a first and an at least a second magnetic signatures respectively; and generating, based at least in part on the first and at least a second magnetic signatures, a re-purposed magnetic signature associated with the common spatial region.

14 Claims, 4 Drawing Sheets

400

Determining a common spatial region defined in accordance with a first spatial region being partially superimposed upon an at least a second spatial region, the first and at least a second spatial regions associated with a first and an at least a second magnetic parameter signatures respectively
410

Generating, based at least in part upon the first and at least a second Magnetic parameter signatures, a re-purposed magnetic signature associated with the common spatial region
420

FIG. 4

INFRASTRUCTURE RE-PURPOSED MAGNETIC SIGNATURE IN MOBILE DEVICE LOCALIZATION

TECHNICAL FIELD

The disclosure herein relates to the field of mobile device indoor navigation and positioning.

BACKGROUND

Indoor navigation or positioning typically involves calibration of specific coordinate positions or locations with regard to signal parameters detectable by various mobile device sensors during traversal of a sequence of such positions. The signal parameters may typically include one or more of magnetic field parameters, received wireless signal strength (RSS), wireless signal connectivity, inertial, barometric and optical measurements. Such calibration typically includes time-consuming and error-prone manual calibration efforts directed at generating and maintaining the fingerprint map, or fingerprint database, of positions within the indoor area. Maintaining an accurate and up-to-date fingerprint map can prove especially challenging in practice, due to the inherently dynamic nature of indoor infrastructure that directly affects the measurements and integrity of magnetic field parameters; for instance, when indoor infrastructure such as internal walls and elevator substructures are modified or added via remodel, changing the physical layout of the indoor infrastructure.

BRIEF DESCRIPTION OF THE DRAWINGS

FIG. 4 illustrates, in an embodiment, a method for establishing a magnetic field signature in accordance with a re-purposed indoor navigation region.

DETAILED DESCRIPTION

Figure 1:
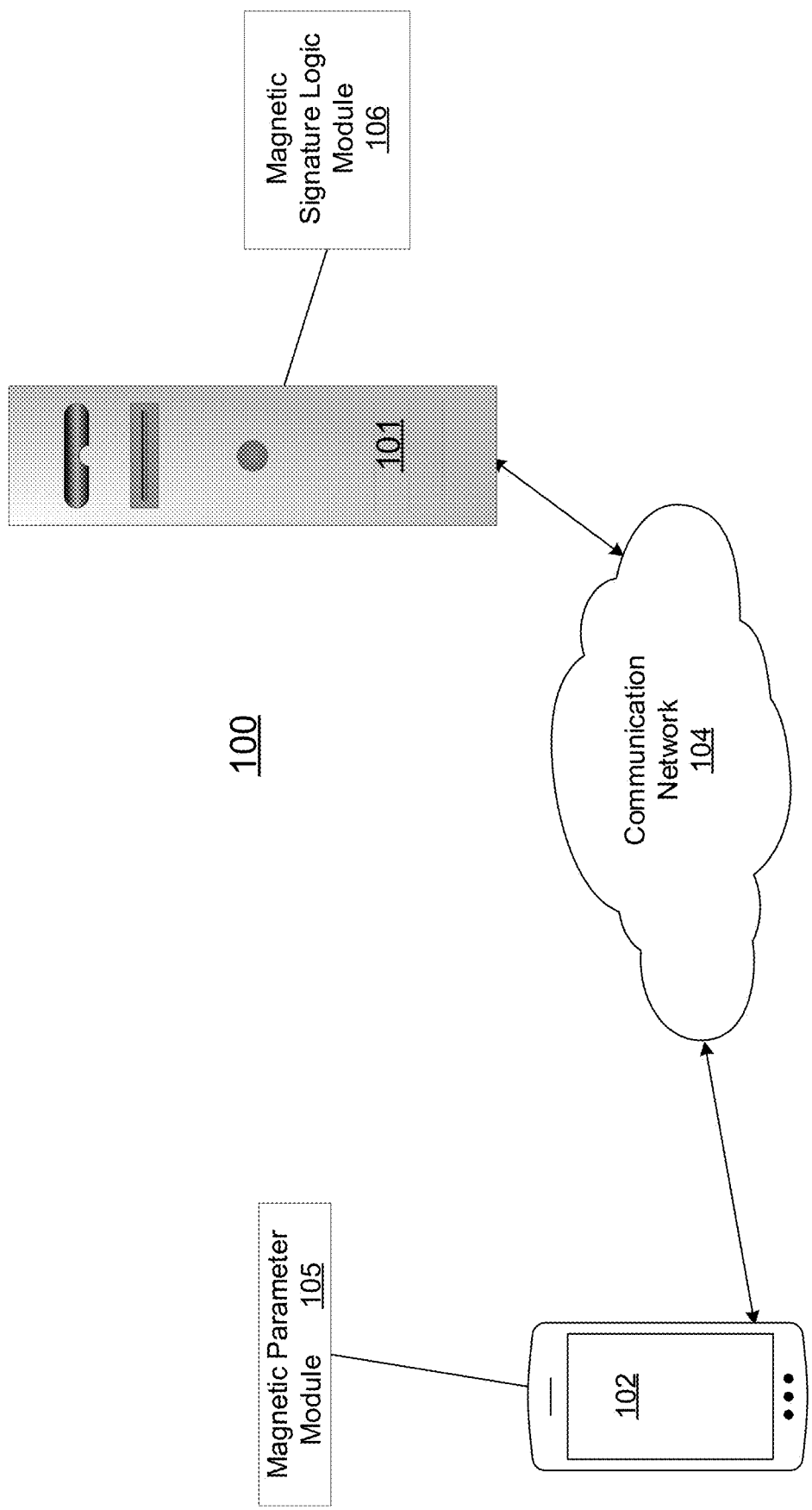
FIG. 1 illustrates, in an example embodiment, a system for mobile device indoor navigation and positioning.

Among other benefits, the disclosure herein provides for re-defining magnetic signatures for mobile device indoor navigation and positioning when pedestrian usage attributes of a region within an indoor area has changed. Indoor spaces may be particularly susceptible to constant or continuing changes in indoor physical infrastructure and materials, due to changes in building use purposes and structural remodeling, for instance. Physical infrastructure changes may significantly affect magnetic parameter characteristics at particular locations as sensed and measured by mobile devices traversing the indoor area. An adverse result may be that magnetic parameter fingerprint database based on previous usage may no longer be accurate or optimal for localizing mobile devices traversing the region in view of the updated usage purposes. Embodiments herein provide systems and techniques for determining a revised magnetic parameter footprint, or magnetic signature as referred to herein, that enables accurate mobile device localization in view of the re-purposed usage, without having to physically re-calibrate magnetic parameter footprint measurements at locations within the re-purposed region of the indoor area. In particular, some embodiments advantageously derive new or updated magnetic signatures based on pre-existing signatures according to pre-existing floor layout for positions where localization is anticipated to be performed based subsequent to the re-purposing.

Embodiments herein recognize that, within an area or region of a given indoor infrastructure, that a pre-existing pedestrian usage type may be change to an updated pedestrian usage type. For example, a conference room within a building may be at least partially demolished in a building renovation that converts from previous usage as a conference room to re-purposing as a corridor walking path. Typically, magnetic signatures already established and mapped to positions related to the conference room usage are no longer accurate or optimal for updated usage as the walking path, because such changes to infrastructure features, such as walls, stairs, elevators ceilings, can affect and modify magnetic characteristics used in localizing a mobile device. In other examples, a conference hall may be mapped for pedestrian mobile device-based navigation usage in accordance with exhibitor booths that are at times densely populated with conference attendees. Once the conference is over, however, it can be desirable to re-purpose, or even revert in some embodiments, to usage as a walking path using a different infrastructure layout arrangement in contrast to that previous layout of exhibitor booths.

Often the magnetic field of an indoor space will change in relation to changes in the structure of the space and the placement or removal of infrastructure objects barriers within the space. Even when the magnetic field as a whole might undergo negligible change, the areas including positions where positioning localization is preformed could change significantly. For example, in the conference center example, when the booths are removed, areas that were previously designated as booths are now available as a walking path.

The term "re-purposing" as used in context of mobile device indoor navigation and positioning herein refers to changing from a pre-existing usage type to an updated usage type within a given area of region of indoor infrastructure. In embodiments, such re-purposing anticipates, and results in, different pedestrian navigation patterns and characteristics within the area or region affected by re-purposed use, including navigation dwell times and navigation path patterns.

Provided is a method of infrastructure re-purposed magnetic signatures for mobile device indoor navigation and positioning. The method, in one embodiment executed in one or more processors of a server computing device, comprises determining a common spatial region in accordance with a first spatial region partially superimposed upon an at least a second spatial region, the first and at least a second spatial regions associated with a first and an at least a second magnetic signatures respectively; and generating, based at least in part on the first and at least a second magnetic signatures, a re-purposed magnetic signature associated with the common spatial region.

Also provided is a server computing system for infrastructure re-purposed magnetic signatures for mobile device indoor navigation and positioning. The server computing system comprises a processor and a memory. The memory includes instructions when executed in the processor causing operations determining a common spatial region in accordance with a first spatial region partially superimposed upon an at least a second spatial region, the first and at least a second spatial regions associated with a first and an at least a second magnetic signatures respectively; and generating, based at least in part on the first and at least a second magnetic signatures, a re-purposed magnetic signature associated with the common spatial region.

Further provided is a non-transitory computer readable medium storing instructions executable in a processor, for infrastructure re-purposed magnetic signatures for mobile device indoor navigation and positioning. The instructions when executed in the processor causing operations comprising determining a common spatial region in accordance with a first spatial region partially superimposed upon an at least a second spatial region, the first and at least a second spatial regions associated with a first and an at least a second magnetic signatures respectively; and generating, based at least in part on the first and at least a second magnetic signatures, a re-purposed magnetic signature associated with the common spatial region.

The terms localize, or localization, as used herein refer to determining a unique coordinate position of the mobile device at a specific location along a route being traversed relative to the indoor area or building. In some embodiments, localization may also include determining a floor within the building, and thus involve determining not only horizontal planar (x, y) coordinates, but also include a vertical, or z, coordinate of the mobile device, the latter embodying a floor number within a multi-floor building or multi-level building, for example. In other embodiments, the (x, y, z) coordinates may be expressed either in a local reference frame specific to the mobile device, or in accordance with a global coordinate reference frame.

The indoor navigation path or route, in embodiments, may encompass an indoor area within any one or a combination of a manufacturing facility, a shopping mall, a warehouse, an airport facility, a hospital facility, a college campus facility or any at least partially enclosed building or other infrastructure.

One or more embodiments described herein provide that methods, techniques, and actions performed by a computing device are performed programmatically, or as a computer-implemented method. Programmatically, as used herein, means through the use of code or computer-executable instructions. These instructions can be stored in one or more memory resources of the computing device. A programmatically performed step may or may not be automatic.

One or more embodiments described herein can be implemented using programmatic modules, engines, or components. A programmatic module, engine, or component can include a program, a sub-routine, a portion of a program, or a software component or a hardware component capable of performing one or more stated tasks or functions. As used herein, a module or component can exist on a hardware component independently of other modules or components. Alternatively, a module or component can be a shared element or process of other modules, programs or machines.

Furthermore, one or more embodiments described herein may be implemented through the use of logic instructions that are executable by one or more processors. These instructions may be carried on a computer-readable medium. In particular, machines shown with embodiments herein include processor(s) and various forms of memory for storing data and instructions. Examples of computer-readable mediums and computer storage mediums include portable memory storage units, and flash memory (such as carried on smartphones). An embedded device as described herein utilizes processors, memory, and logic instructions stored on computer-readable medium. Embodiments described herein may be implemented in the form of computer processor-executable logic instructions or programs stored on computer memory mediums.

System Description

FIG. 1 illustrates, in an example embodiment, a system for mobile device indoor navigation and positioning. FIG. 1 illustrates re-purposed magnetic signature system 100 for mobile device indoor navigation and positioning, using server computing device 101, in conjunction with mobile device 102 in an example embodiment. Magnetic field sensing mobile device 102 may include a processor, memory and associated circuitry to accomplish any one or more of telephony, data communication, and data computing. Magnetic field sensing mobile device 102 may be in communication with one or more wireless communication signal sources deployed within the indoor area. Wireless communication signal sources as referred to herein can be based on a wireless access point device deployed within the indoor area, for example incorporating different wireless signal communication protocols such as Wi-Fi, Bluetooth, and other wireless signal protocols. Server 101 may include magnetic fingerprint data of coordinate positions or locations stored in a magnetic fingerprint database, associated with a pedestrian area, such as a factory manufacturing floor or multiple floors, stored locally, or remotely accessible. In other variations, magnetic field sensing mobile device 102, variously referred to herein as mobile device 102, may be connected within a computer network communication system 104, including the internet or other wide area network, to server computing device 101 storing the magnetic fingerprint data of the pedestrian area. The magnetic fingerprint data of the pedestrian area can be communicatively accessible to magnetic field sensing mobile device 102 for download of the magnetic fingerprint data.

A pedestrian navigation, or indoor positioning, software application such as magnetic parameter sensing module 105 may be downloaded and installed, or stored, in a memory of magnetic field sensing mobile device 102 and further include a physical layout map of the associated indoor infrastructure being navigated or traversed. In one embodiment, the pedestrian navigation software application may incorporate one or more portions of processor-executable instructions manifesting magnetic parameter sensing module 105. The terms localize or localization as used herein refer to determining an estimated coordinate position (x, y, z) along a pedestrian route or trajectory being traversed in accompaniment of magnetic field sensing mobile device 102.

Magnetic field sensing mobile device 102, also referred to as mobile device 102 herein, may include sensor functionality by way of sensor devices. The sensor devices may include inertial sensors such as an accelerometer and a gyroscope, magnetometer or other magnetic field sensing functionality, barometric or other ambient pressure sensing functionality, humidity sensor, thermometer, and ambient lighting sensors such as to detect ambient lighting intensity. Magnetic field sensing mobile device 102 may also include capability for detecting wireless signal strengths as received in accordance with ambient wireless communication signals according to various signal protocols including but not limited to any of Bluetooth and Bluetooth Low Energy (BLE), Wi-Fi, RFID, and also satellite-based navigations signals including global positioning system (GPS) signals. Magnetic field sensing mobile device 102 further includes the capability for detecting, via sensor devices, and measuring magnetic field parameters, including magnetic field strength, magnetic dip angle and magnetic or compass direction, prevailing at given positions within or proximate the indoor area. Magnetic field sensing mobile device 102, also referred to herein as mobile device 102, may also sense and determine signal connectivity parameters related to ambient or prevailing wireless signals. In particular, magnetic field sensing mobile device 102 may include location determination capability by way of a GPS module having a GPS receiver, and a communication interface for communicatively coupling to communication network 104, including by sending and receiving cellular data over data and voice channels.

A fingerprint data repository, or any portion(s) thereof, may be stored in server computing device 101 (also referred to herein as server 101) and made communicatively accessible to magnetic field sensing mobile device 102 via communication network 104. Server 101 includes magnetic signature logic module 106 comprised of instructions executable in a processor of server device 101, for use in conjunction with the fingerprint data repository that includes magnetic fingerprint data. In some embodiments, it is contemplated that the fingerprint data repository, or any portions of data and processor-executable instructions constituting the fingerprint data repository, may be downloaded for storage, at least temporarily, within a memory of Magnetic field sensing mobile device 102. In embodiments, the fingerprint map data stored in the fingerprint data repository further associates particular positions along pedestrian route of the manufacturing facility or indoor area with a particular combination of time-stamped fingerprint data, including gyroscope data, accelerometer data, wireless signal strength data, wireless connectivity data, magnetic data, barometric data, acoustic data, line-of sight data, and ambient lighting data stored thereon.

The terms fingerprint and fingerprint data as used herein refer to time-correlated, time-stamped individual measurements of any of, or any combination of, received wireless communication signal strength and signal connectivity parameters, magnetic field parameters (strength, direction) or barometric pressure parameters, and mobile device inertial sensor data at known, particular locations along a route being traversed, and also anticipated for traversal, by the mobile device. In other words, a fingerprint as referred to herein may include a correlation of sensor and signal information (including, but not necessarily limited to wireless signal strength, wireless connectivity information, magnetic or barometric information, inertial sensor information and GPS location information) associated for a unique location relative to the facility in accordance with a particular time stamp of gathering the set of mobile sensor data by time correlating the mobile device gyroscope data, the mobile device accelerometer data, mobile device magnetometer data and any other applicable mobile device sensor data, for example. Thus, fingerprint data associated with a particular location or position may provide a fingerprint signature that uniquely correlates to that particular location or position. A sequence of positions or locations that constitute a navigation path traversed by the mobile device relative to a given indoor facility may be fingerprint-mapped during a calibration process, and the resulting fingerprint map stored in a fingerprint data repository of server 101. Server 101 may store respective fingerprint maps of various buildings and indoor areas. The respective building or indoor facility fingerprint maps, or any portions thereof, may be downloaded into a memory of magnetic field sensing mobile device 102 for use in conjunction with the pedestrian navigation software application executing thereon.

A particular magnetic fingerprint, also referred to as magnetic signature herein, based on any of received wireless communication signal strength and signal connectivity parameters, magnetic field parameters or barometric pressure parameters, and mobile device inertial sensor data may be detected or recorded by magnetic field sensing mobile device 102, whereupon the fingerprint or signature as detected may be matched to a reference fingerprint, or a reference pattern including a set of fingerprints, in a stored fingerprint map of a given facility made accessible to magnetic parameter sensing module 105 to identify a unique position of mobile device 102 along a pedestrian route. In embodiments, the magnetic field parameter sensed at mobile device 102 is a magnetic field strength. In some embodiments, the magnetic field strength comprises one or more magnetic field (x, y, z) vector components. As used herein, term signal connectivity, as distinguished from a signal strength, refers to a wireless radio frequency (RF) signal being available for use in bi-directional data communication, such as between devices that both transmit and receive data using that available wireless RF signal. In some embodiments, given that sampling times and sampling rates applied in conjunction with particular mobile device sensors may be different, the signal and sensor information as measured during the fingerprint calibration process may be time-averaged across particular periods of time, with the time-averaged value being used to represent the signal information at any given instance of time within that particular period of time in which the signal information is time-averaged. Fingerprint data may be used to track traversal of magnetic field sensing mobile device 102 along a sequence of positions that constitute a pedestrian route within, and even adjoining, the indoor facility.

Magnetic parameter sensing module 105, constituted of logic instructions executable in a processor of magnetic field sensing mobile device 102 in one embodiment, enables wireless communication of localization parameters and functionality with server computing device 101.

Figure 2:
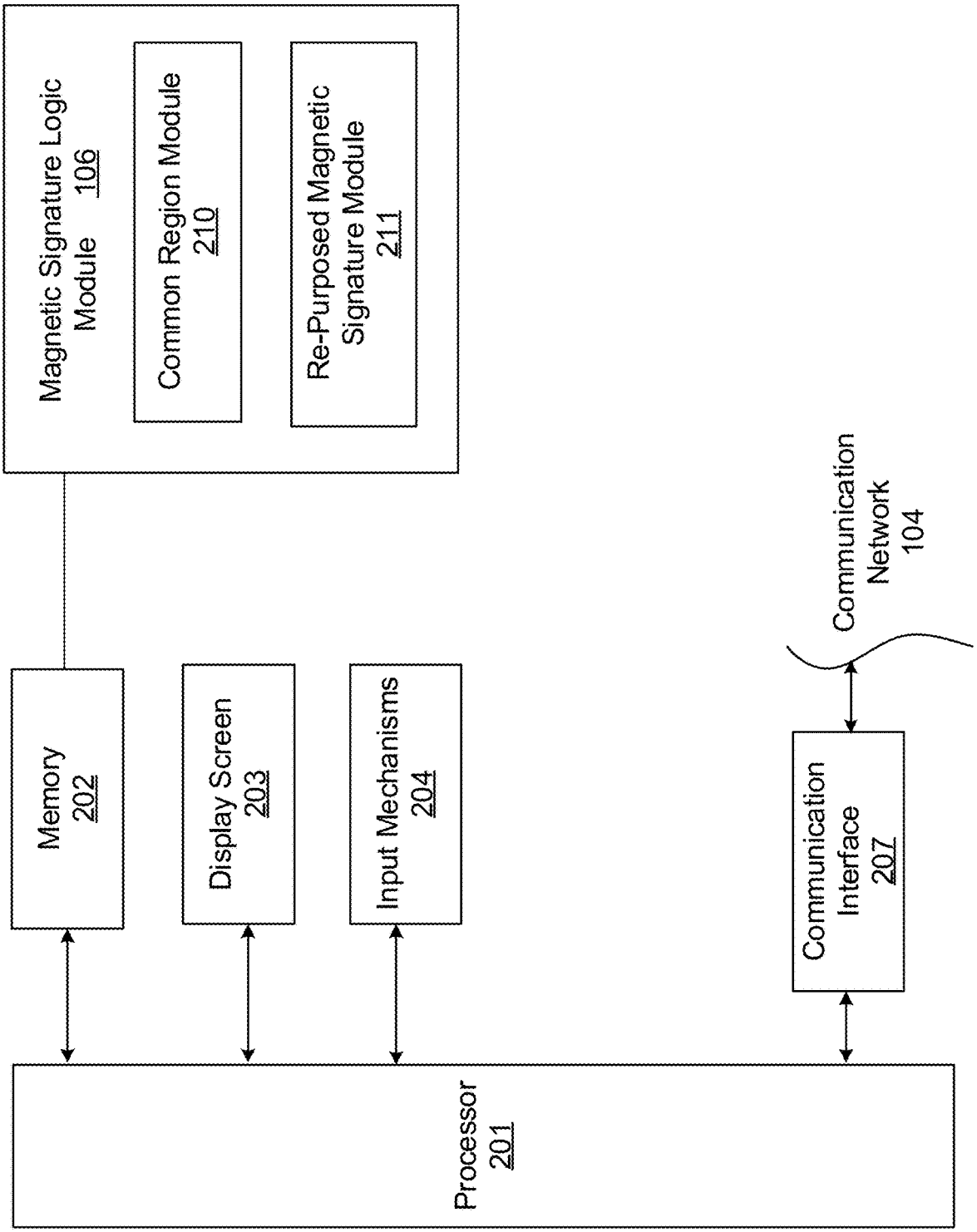
FIG. 2 illustrates, in one example embodiment, an architecture of a server computer system for mobile device indoor navigation and positioning.

FIG. 2 illustrates, in one example embodiment, an architecture of a server computer system for mobile device indoor navigation and positioning, used in establishing a magnetic field parameter-based signature or footprint associated with respective positions encompassed within a re-purposed region or area of an indoor infrastructure. Server computer 101 (also referred to herein as server 101) in embodiment architecture 200 may be implemented on one or more server devices. Server 101 includes processor 201, memory 202 which may include a read-only memory (ROM) as well as a random access memory (RAM) or other dynamic storage device, display device 203, input mechanisms 204 and communication interface 207 communicatively coupled to communication network 104. Processor 201 is configured with software and/or other logic to perform one or more processes, steps and other functions described with implementations, including such as described by FIGS. 1-4 herein. Processor 201 may process information and instructions stored in memory 202, such as provided by a random access memory (RAM) or other dynamic storage device, for storing information and instructions which are executable in processor 201. Memory 202 also may be used for storing temporary variables or other intermediate information during execution of instructions to be executed by processor 201. Memory 202 may also include the ROM or other static storage device for storing static information and instructions for processor 201; a storage device, such as a magnetic disk or optical disk, may be provided for storing information and instructions. Communication interface 207 enables server 101 to communicate with one or more communication networks 104 (e.g., a cellular network) through use of the both wired and wireless network links. Using the network link, server 101 can communicate with magnetic field sensing mobile device 102.

Magnetic signature logic module 106 of server 101 may include executable instructions comprising sub-modules re-purposed common region module 210 and re-purposed magnetic signature module 211.

Processor 201 uses executable instructions of re-purposed common region module 210 to determine a common spatial region in accordance with a first spatial region partially superimposed upon an at least a second spatial region, the first and at least a second spatial regions associated with a first and an at least a second magnetic signatures respectively.

Processor 201, uses executable instructions stored in re-purposed magnetic signature module 211 to generate, based at least in part on the first and at least a second magnetic signatures, a re-purposed magnetic signature associated with the common spatial region.

Methodology

Figure 3A:
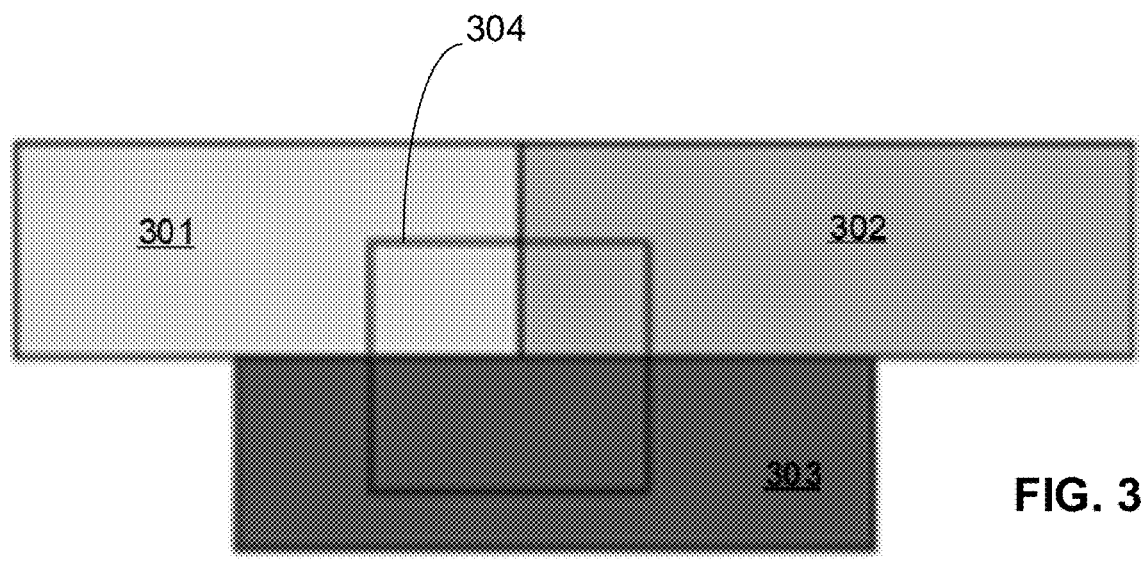
FIGS. 3A, 3B and 3C illustrate, in example embodiments, a magnetic field model in accordance with a re-purposed indoor navigation region.
Figure 3B:
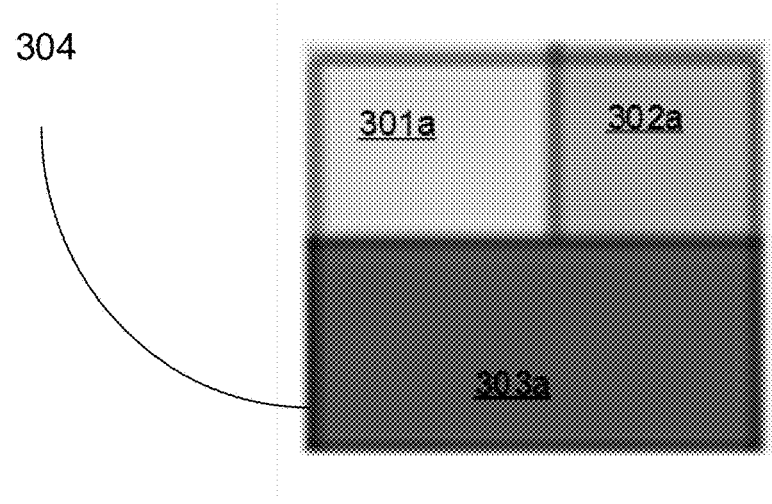
Figure 3C:
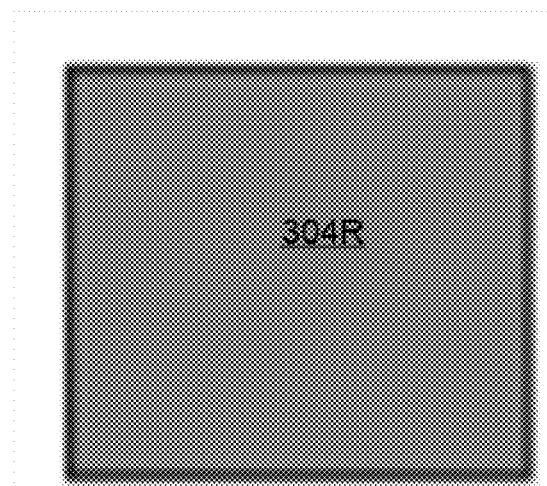

FIGS. 3A, 3B and 3C illustrate, in example embodiments, a magnetic field model in accordance with a re-purposed indoor navigation region. In describing examples of FIGS. 3A, 3B and 3C, reference is made to the examples of FIGS. 1-4 for purposes of illustrating suitable components or elements for performing a step or sub-step being described.

In the embodiment of FIG. 3A, pre-existing mapped regions 301, 302 and 303 may overlap based on defining a new, or common region 304. New common region 304 of interest for localizing mobile devices during traversal may include, or be superimposed on, portions of pre-existing regions 301, 302 and 303 having respective magnetic signatures in an existing fingerprint database. FIG. 3B depicts common region 304 in more detail, constituted of portions 301a, 302a and 303a of the intersecting input regions 301, 302 and 303 respectively.

FIG. 3C shows region 304a, in an embodiment of common region 304. magnetic signatures of common region 304a are re-defined, or calculated, based on respective magnetic characteristics of the intersecting regions 301, 302 and 303 in accordance with the re-purposed pedestrian usage within common region 304a. In such embodiment, the new magnetic mean and magnetic variance parameter associated with particular positions within common region 304a are calculated based on a weighted mean of the input regions 301-303, where the weights are designated as the proportion of overlapping area that constitutes common region 304a.

In embodiments, the re-purposed magnetic signature comprises a weighted magnetic parameter mean value computed based at least in part on respective magnetic parameter mean values associated with the first and the at least a second spatial regions.

In an embodiment, the updated, or re-purposed, magnetic parameter mean $\overline{M}$ and variance parameter $\sigma_M^2$ are calculated based on weighted mean of the intersecting input regions, where the weights are designated as the proportion of overlapping, or partially superimposed, areas formed from each respective intersecting input region. In an embodiment as follows, the magnetic parameter is a magnetic field strength, and the approximate magnetic field strength based on nearby trajectories may be inferred according to:

$$\overline{M} = \frac{\sum A_i M_i}{A_T}$$

$$\sigma_M^2 = \frac{\sum A_i (M_i - \overline{M})}{A_T}$$

Where $A_T$ represents the total area of input segments and $A_i$ represents the intersecting portion area of a respective i-th intersecting input region that is included in the new common region defined by overlap of the intersecting input regions. The weighted magnetic parameter mean value is computed based at least in part on a proportion of overlap that is contributed respectively by the first and at least a second spatial regions.

FIG. 4 illustrates, in an embodiment, a method for establishing a magnetic field signature in accordance with a re-purposed indoor navigation region. Examples of method steps described herein relate to the use of server 101 in conjunction with magnetic field sensing mobile device 102 for implementing the techniques described. According to one embodiment, the techniques are performed by server 101 in conjunction with magnetic parameter sensing module 105 of mobile device 102 in response to execution of one or more sequences of software logic instructions that constitute magnetic signature logic module 106.

In embodiments, magnetic signature logic module 106 can include the one or more sequences of instructions within any one or more, or parts, of sub-modules including re-purposed common region module 210, and re-purposed magnetic signature module 211. Such instructions may be read into memory 202 of server 101 from machine-readable medium, such as memory storage devices, or downloaded into memory 202 via network communication interface 207. In executing the sequences of instructions of re-purposed common region module 210 and re-purposed magnetic signature module 211, processor 201 performs the process steps described herein. In alternative implementations, at least some hard-wired circuitry may be used in place of, or in combination with, the software logic instructions to implement examples described herein.

Thus, the examples described herein are not limited to any particular combination of hardware circuitry and software instructions. Additionally, it is contemplated that in alternative embodiments, the techniques herein, or portions thereof, may be distributed between magnetic field sensing mobile device 102 and remote but communicatively accessible server computing device 101.

At step 410, processor 201 executes instructions included in re-purposed common region module 210 to determine a common spatial region in accordance with a first spatial region partially superimposed upon an at least a second spatial region, the first and at least a second spatial regions associated with a first and an at least a second magnetic parameter signatures respectively.

At step 420, processor 201 executes instructions included in re-purposed magnetic signature module 211 to generate, based at least in part on the first and at least a second magnetic signatures, a re-purposed magnetic signature associated with the common spatial region.

In embodiments, the re-purposing is associated with one or more structural features of the indoor facility, such as a wall or a partition, being interposed or removed as compared to a previous layout of the indoor infrastructure. Such magnetic field modifying walls, partitions, escalators, elevators may be constructed of of structural materials that affect prevailing magnetic field characteristics experience at a given location within the indoor area masonry, plastics, wood, glass and fabric, in embodiments.

In embodiments, the at least one of the first and the at least a second spatial region is directed to a first pedestrian usage purpose and the common spatial region encompasses a second pedestrian usage purpose, the first and second pedestrian usage purposes associated with a first and a second pedestrian traversal characteristics respectively. Such re-purposing anticipates, and results in, different pedestrian traversal patterns or pedestrian traversal characteristics within the area or region affected by re-purposed use, including navigation dwell times and navigation path patterns as recorded by, and acquired by server 101 from, magnetic field sensing mobile device 102. In example embodiments, a longer dwell time, exhibited over a given traversal route length or within a spatial area for pedestrian users on average, is associated with a usage as a conference room or exhibition booth. In contrast, a shorter dwell time per pedestrian user is experienced with usage as a pedestrian usage path, associated with more transient user navigation or traversal usage.

In some embodiments, the first and the at least a second magnetic signatures comprises at least one of: a first and an at least a second magnetic parameter mean values respectively, and a first and an at least a second magnetic parameter variance values respectively.

In embodiments, the re-purposed magnetic signature comprises a weighted magnetic parameter mean value computed based at least in part on respective magnetic parameter mean values associated with the first and the at least a second spatial regions.

In such embodiments, the updated, or re-purposed, magnetic parameter mean $\overline{M}$ and variance parameter $\sigma_M^2$ are calculated based on weighted mean of the intersecting input regions, where the weights are designated as the proportion of overlapping, or partially superimposed, areas formed from each respective intersecting input region. In an embodiment as follows, the magnetic parameter is a magnetic field strength, and the approximate magnetic field strength based on nearby trajectories may be inferred according to:

$$\overline{M} = \frac{\sum A_i \overline{M}_i}{A_T}$$

$$\sigma_M^2 = \frac{\sum A_i (M_i - \overline{M})}{A_T}$$

Where $A_T$ represents the total area of input segments and $A_i$ represents the intersecting portion area of a respective i-th intersecting input region that is included in the new common region defined by overlap of the intersecting input regions. The weighted magnetic parameter mean value is computed based at least in part on a proportion of overlap that is contributed respectively by the first and at least a second spatial regions.

In some embodiments, $A_i$ represents a weighting factor based on the distance to the interpolated location point at which the magnetic field parameter is being estimated or inferred. When fusing magnetic data between various trajectories/user sources, it is important to ensure that the resulting fusion takes into account an absolute measurement type. For example, if a moving average is being performed, then the magnetic data would be influenced based on the specific path and direction that the user has traversed. Conversely, the magnetic data can focus on the instantaneous raw magnetic parameter values (e.g., magnitude, or magnitude of vertical/horizontal component, or in the specific North, East, Down directions), then these would be independent of the averaging.

In further embodiments, mobile device-specific biases and variations in the magnetometer data and/or the presence of external permanent magnetic anomalies may be accounted for. For example, many users have small magnets located on their smartphone (e.g., for attaching to an in-car holder). The presence of these types of disturbances could cause issues when combining different data from different users. In order to compensate for this, baseline magnetic field magnitude readings over the long-term (e.g., using a centered moving average, which can be efficiently calculated) may be considered or estimated. When the overall averaging is acquired over a sufficiently long period with data determined to not be in the presence of a magnetic field, then the device-specific bias/offset can be calculated. These factors can be absorbed or incorporated within the $A_i$ factor to ensure an appropriate fusion of the per-user magnetic field data, in addition to its distance from the inferred point.

In some embodiments, the re-purposed magnetic signature comprises a weighted magnetic parameter variance value computed based at least in part on respective magnetic parameter variance values associated with the first and the at least a second spatial regions.

In some aspects, the weighted magnetic parameter variance value is computed based at least in part on a proportion of overlap in the first and at least a second spatial regions.

In some variations, the method further comprises deploying the re-purposed magnetic signature, based on magnetic parameter mean $\overline{M}$ and variance parameter $\sigma_M^2$ for respective locations encompassed by the common spatial region defined by the overlap of intersecting input regions, and localizing a mobile device during traversal of the indoor area in accordance with the re-purposed magnetic signature and the location.

It is contemplated for embodiments described herein to extend to individual elements and concepts described herein, independently of other concepts, ideas or system, as well as for embodiments to include combinations of elements recited anywhere in this application. Although embodiments are described in detail herein with reference to the accompanying drawings, it is to be understood that the invention is not limited to those precise embodiments. As such, many modifications and variations will be apparent to practitioners skilled in this art. Accordingly, it is intended that the scope of the invention be defined by the following claims and their equivalents. Furthermore, it is contemplated that a particular feature described either individually or as part of an embodiment can be combined with other individually described features, or parts of other embodiments, even if the other features and embodiments make no specific mention of the particular combination of features. Thus, the absence of describing combinations should not preclude the inventors from claiming rights to such combinations.

What is claimed is:

1. A method comprising:
    determining a common spatial region in accordance with a first spatial region partially superimposed upon an at least a second spatial region, the first and at least a second spatial regions associated with a first and an at least a second magnetic signatures respectively; and
    generating, based at least in part on the first and at least a second magnetic signatures, a re-purposed magnetic signature associated with the common spatial region, wherein the re-purposed magnetic signature comprises one of a weighted magnetic parameter mean value and a weighted magnetic parameter variance value, the weighted magnetic parameter mean value and the weighted magnetic parameter variance value being computed based at least in part on respective magnetic parameter mean values and respective magnetic parameter variance values associated with the first and the at least a second spatial regions, the weighted magnetic parameter mean value being computed based at least in part on a proportion of overlap in the first and the at least a second spatial regions.

2. The method of claim 1 wherein at least one of the first and at least a second magnetic signatures are established based at least in part on a magnetic characteristic measurement acquired at a mobile device under traversal within an indoor infrastructure, the first and at least a second spatial regions located within or proximate the indoor infrastructure.

3. The method of claim 2 wherein the magnetic characteristic measurement comprises a magnetic field strength value as measured at a magnetometer sensor device of the mobile device.

4. The method of claim 3 wherein the magnetic characteristic measurement comprises a vector (x, y, z) component of the magnetic field strength.

5. The method of claim 1 wherein the at least one of the first and the at least a second spatial region is directed to a first pedestrian usage purpose and the common spatial region encompasses a second pedestrian usage purpose, the first and second pedestrian usage purposes associated with a first and a second pedestrian traversal characteristics respectively.

6. The method of claim 1 wherein the first and the at least a second magnetic signatures comprises at least one of: a first and an at least a second magnetic parameter mean values, and a first and an at least a second magnetic parameter variance values respectively.

7. The method of claim 1 wherein the weighted magnetic parameter variance value is computed based at least in part on a proportion of overlap in the first and the at least a second spatial regions.

8. A server computing system comprising:
a processor; and
a memory including instructions when executed in the processor causing operations comprising:
determining a common spatial region in accordance with a first spatial region partially superimposed upon an at least a second spatial region, the first and at least a second spatial regions associated with a first and an at least a second magnetic signatures respectively; and
generating, based at least in part on the first and at least a second magnetic signatures, a re-purposed magnetic signature associated with the common spatial region, wherein the re-purposed magnetic signature comprises one of a weighted magnetic parameter mean value and a weighted magnetic parameter variance value, the weighted magnetic parameter mean value and the weighted magnetic parameter variance value being computed based at least in part on respective magnetic parameter mean values and respective magnetic parameter variance values associated with the first and the at least a second spatial regions, the weighted magnetic parameter mean value being computed based at least in part of a proportion of overlap in the first and the at least a second spatial regions.

9. The server computing system of claim 8 wherein at least one of the first and at least a second magnetic signatures are established based at least in part on a magnetic characteristic measurement acquired at a mobile device under traversal within an indoor infrastructure, the first and at least a second spatial regions located within or proximate the indoor infrastructure.

10. The server computing system of claim 9 wherein the magnetic characteristic measurement comprises a magnetic field strength value as measured at a magnetometer sensor device of the mobile device.

11. The server computing system of claim 10 wherein the magnetic characteristic measurement comprises a vector (x, y, z) component of the magnetic field strength.

12. The server computing system of claim 8 wherein the at least one of the first and the at least a second spatial region is directed to a first pedestrian usage purpose and the common spatial region encompasses a second pedestrian usage purpose, the first and second pedestrian usage purposes associated with a first and a second pedestrian traversal characteristics respectively.

13. The server computing system of claim 8 wherein the first and the at least a second magnetic signatures comprises at least one of: a first and an at least a second magnetic parameter mean values, and a first and an at least a second magnetic parameter variance values respectively.

14. The server computing system of claim 8 wherein the weighted magnetic parameter variance value is computed based at least in part on a proportion of overlap in the first and the at least a second spatial regions.

* * * * *